(12) United States Patent
Kiriaki

(10) Patent No.: US 6,252,421 B1
(45) Date of Patent: Jun. 26, 2001

(54) DIFFERENTIAL, HIGH SPEED, ECL TO CMOS CONVERTER

(75) Inventor: Sami Kiriaki, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/123,213

(22) Filed: Jul. 27, 1998

(51) Int. Cl.[7] ............................................. H03K 19/0175
(52) U.S. Cl. ................................. 326/77; 326/66; 326/84
(58) Field of Search ............................... 326/18, 66, 84, 326/77, 126, 127, 109, 110

(56) References Cited

U.S. PATENT DOCUMENTS

| | | | | |
|---|---|---|---|---|
| 4,906,871 | * | 3/1990 | Iida ........................................ | 307/475 |
| 5,463,332 | * | 10/1995 | Yee et al. .............................. | 326/126 |
| 5,754,059 | * | 5/1998 | Tanghe et al. ......................... | 326/77 |

* cited by examiner

Primary Examiner—Michael Tokar
Assistant Examiner—Anh Tran
(74) Attorney, Agent, or Firm—Alan K. Stewart; Wade James Brady, III; Frederick J. Telecky, Jr.

(57) ABSTRACT

The invention relates to the interfacing of high speed, low voltage data streams with CMOS circuits and, more specifically, to converting low voltage, differential ECL signals levels to higher voltage levels which are compatible with CMOS circuits while maintaining high speed and sufficient drive capability. This is accomplished by making first stage inverters 5 and 6 as geometrically small as possible subject to the design rules in use to minimize the capacitance at the input of these inverters. The inputs of the first stage inverters are clamped by bias circuits 9/10/11 and 12/13/14 at DC levels so as to provide a narrow range of operation. Additional output inverters 7 and 8 act as buffers to provide the needed capacitive load drive capability.

5 Claims, 3 Drawing Sheets

DIFFERENTIAL, HIGH SPEED, ECL TO CMOS CONVERTER

CROSS-REFERENCE TO RELATED APPLICATION

This invention is related to the invention disclosed and claimed in co-pending U.S. patent application, filed of even date with the filing date of this application Ser. No. 09/123,208, the contents of which are hereby incorporated by reference in this Application.

BACKGROUND OF THE INVENTION

1. Field of the Invention

This invention relates to the interfacing of high speed, low voltage, data streams with CMOS circuits and, more specifically, to converting low voltage, differential, ECL signal levels to higher voltage levels which are compatible with CMOS circuits while maintaining high speed and sufficient drive capability.

2. Brief Description of the Prior Art

Differential Emitter Coupled Logic (ECL) circuitry is often used in high speed data transmission applications due to its small signal nature and resulting higher speed of operation. The differential aspect of these low level signals provides improved signal-to-noise, due to common mode operation at the receiving end of the transmission. However, it is important that these low level ECL signals be converted to higher levels without a significant degradation in speed and that the output of the converter has sufficient drive capability to make it useful for a particular application.

Existing circuits of this type often make the ECL to CMOS level conversion at the expense of speed and/or drive capability. Inherently, the lower ECL levels can be switched faster than the larger CMOS levels, but attempts to speed up the conversion process often diminish the output drive capability of the circuit. Representative prior circuits of this general type are shown in U.S. Pat. No. 5,726,588 to Fiedler, U.S. Pat. No. 55,606,268 to Van Brunt and U.S. Pat. No. 5,426,381 to Flannagan et al. None of these patents discloses or suggests the novel features of the present invention.

SUMMARY OF THE INVENTION

This invention addresses the conversion of small ECL level signals to CMOS level (typically 5 volt or greater) signals with the highest possible speed and drive capability. The basic approach in the invention is to keep the circuitry simple with as few parts as possible, since generally, the fewer the number of parts, the faster the circuit will be.

Briefly, a differential pre-amplifier with constant current source is used to dynamically sink and source current in the two legs of the amplifier based on the ECL signal levels at the input of the amplifier. In order to achieve the highest possible speed, the load capacitance at the output of the differential pre-amplifier is kept as small as possible. This is accomplished by designing the first stage inverters or other form of buffers, which are driven by the differential pre-amplifier, with the smallest possible geometries on the integrated circuit;. Drive capability is then provided by means of an additional buffer which may take the form of an inverter.

In an embodiment, circuit speed is addressed by biasing the input to the first inverter stage, driven by the output of the differential pre-amplifier, at a DC level at the trip point of the inverter. Since only a small voltage swing around this DC level can cause the inverter's output to switch between the $V_d$ and $V_s$ CMOS voltage levels, the speed of the circuit is increased. The desired low capacitance level at the input to this first inverter stage is achieved by designing the stage using the minimum device geometry consistent with the particular set of design rules being used. Since the first stage inverter is designed with minimum geometries, however, a second stage inverter is needed with larger geometries in order to meet the desired drive requirements. The minimization of the capacitive loading on the differential pre-amplifier, the biasing of the first stage inverter or buffer at its trip point, and the use of additional buffers or inverters to provide adequate drive capability provide a uniquely fast and powerful converter.

DESCRIPTION OF THE PREFERRED EMBODIMENT

Figure 1:
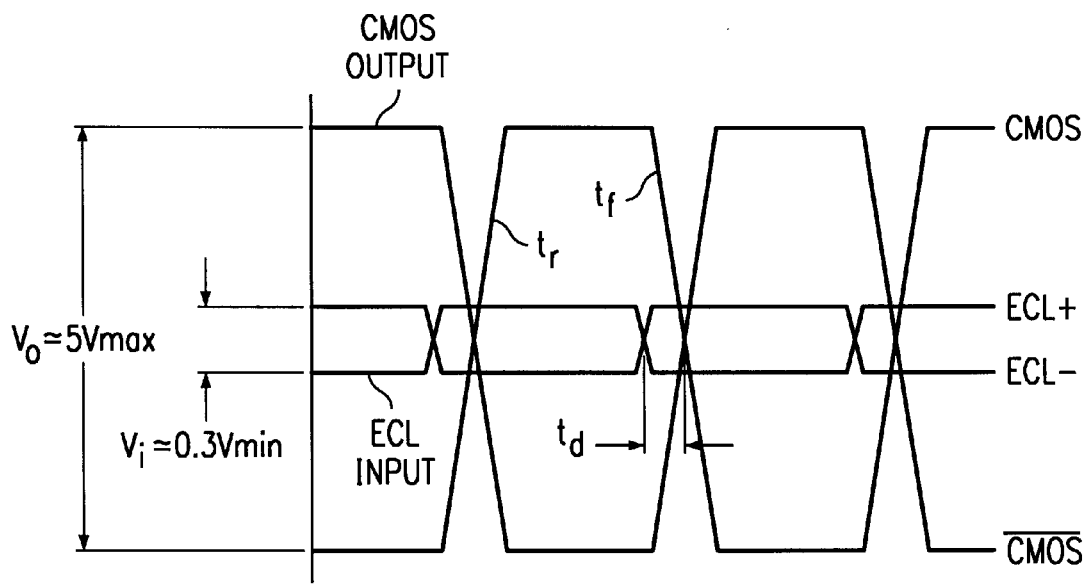
FIG. 1 illustrates the; ECL to CMOS levels involved in the conversion.

FIG. 1 illustrates the ECL to CMOS conversion process. As shown, the differential ECL input pulse $V_i$ can have an amplitude as low as 0.3 volts while the resulting complementary CMOS output pulse $V_o$ can be as large as 5 volts or greater. In FIG. 1, $t_d$ indicates the delay time between the ECL input and CMOS output pulses while $t_r$ and $t_f$ represent the rise and fall times of the CMOS output pulse. The goal of the circuit is to keep these parameters as small as possible in order to maintain high speed operation.

Figure 2:
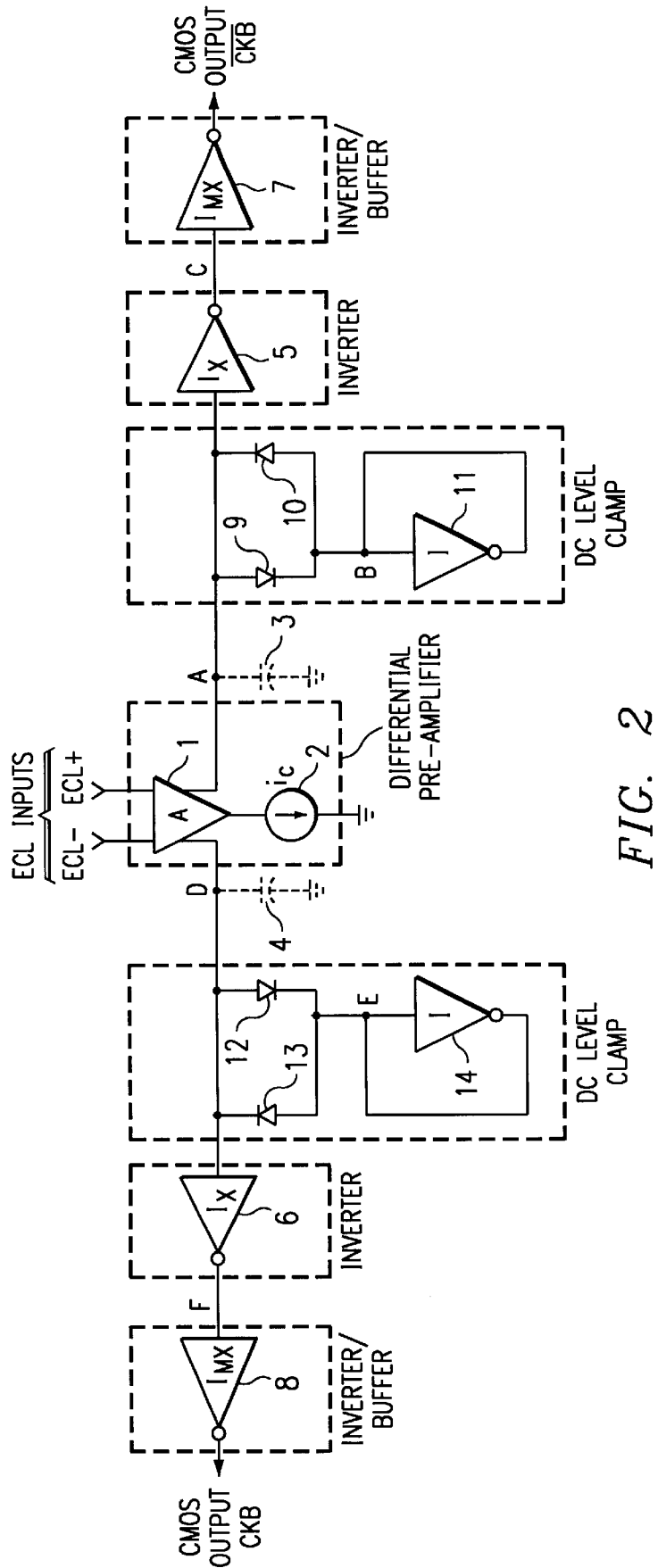
FIG. 2 shows a block diagram for the ECL to CMOS converter.

FIG. 2 shows a block diagram for the preferred embodiment of the invention. In this embodiment, the differential pre-amplifier consists of a basic differential amplifier 1 and a constant current source 2. Complementary ECL inputs ECL− and ECL+ are coupled to the inputs of the differential pre-amplifier. The differential outputs of the pre-amplifier drive circuit nodes A and D. A major goal of the circuit design is to maintain the capacitance at these two nodes, shown as phantom capacitors 3 and 4 respectively, as low as possible. The outputs of the differential pre-amplifier drive inverters 5 and 6. These inverters are labeled $I_x$, where x indicates minimum geometries for the chip design rules being used. Keeping these inverters small tends to lower the capacitance at nodes A and D which, in turn, enhances the speed of the circuit. While inverters are used in this preferred embodiment, it is equally within the contemplation of the invention that non-inverting buffers can be employed as an alternative. This element, whether inverting or not, may alternatively be referred to as an inverter or as a buffer or buffer stage in this description and in the claims.

The outputs of inverters 5 and 6 switch between CMOS levels $V_d$ and $V_s$, assumed in the preferred embodiment to be +5V and ground respectively. Since the dynamic voltages at nodes A and D are small, it is desirable to bias the inputs of inverters 5 and 6 very close to their threshold voltages or trip points. This is accomplished by diode pairs 9–10 and 12–13 which provide a DC level by clamping the inputs to inverters 5 and 6 to within ± one diode drop of the inverter's trip point. This DC level is established by connecting the outputs of additional inverters 11 and 14 to their respective inputs. Finally, additional output inverters 7 and 8 are added to provide adequate drive capability for the loads to be connected to the converter. These two buffers are labeled $I_{mx}$ where mx implies slightly larger circuit geometries, e.g., 2× or 3×.

Figure 3:
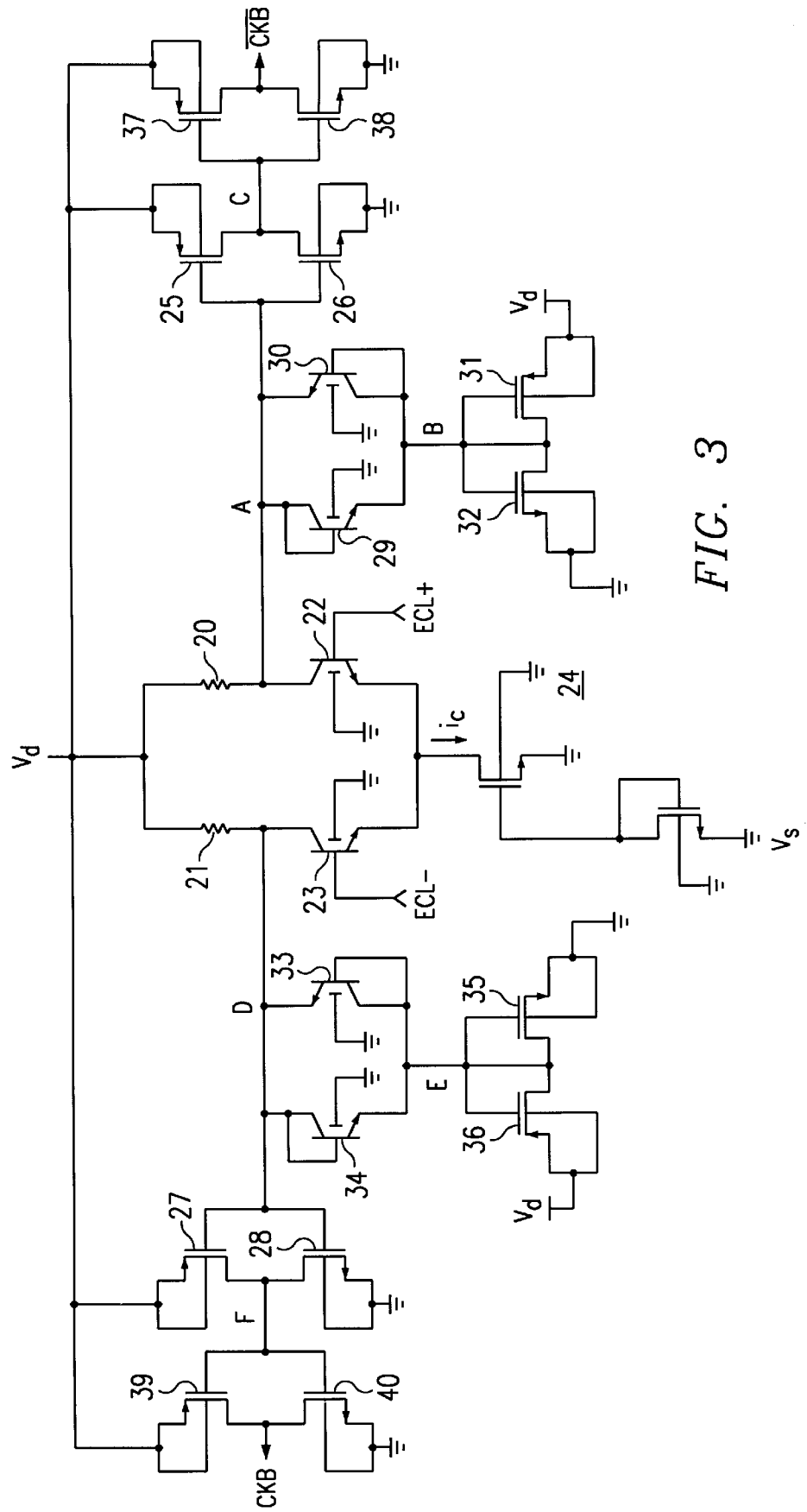
FIG. 3 shows a schematic circuit diagram for the ECL to CMOS converter.

FIG. 3 shows a detailed schematic for an implementation of the circuit. As discussed earlier, the CMOS levels of $V_d$ and $V_s$ may be +5V and ground. Here the differential pre-amplifier consists of transistors 22 and 23 and resistors 20 and 21 along with a constant current source 24. The small differential ECL level inputs signals, labeled ECL+ and ECL−, at the base of transistors 22 and 23, respectively direct the sourcing and sinking of current in the two legs of the amplifier. The outputs of the differential pre-amplifier drive the minimum capacitance at nodes A and D and are the inputs to inverters on each side of the complementary circuit. These inverters are comprised of transistor pairs 25–26 and 27–28. Each inverter includes a p-channel transistor 25 or 27 and an n-channel transistor 26 or 28. These inverters are designed to have the minimum component dimensions possible for the chosen process design rules being used in the design so as to keep the capacitance at nodes A and D low. The output of these inverters, shown at nodes C and F are at CMOS levels and complementary to the signals from the differential pre-amplifier, i.e., if the ECL+ signal goes high, the amplifier output at node A tends to go low and the inverter output at node C goes high.

To enhance the speed of the converter circuit,; the inputs to inverters 25–26 and 27≧28 at nodes A and D are biased at DC levels which are ± one diode drop from the trip points of the inverters, providing a narrow range of operation for the circuit. The trip point DC level is established at nodes B and E by tying the outputs of additional inverters 31–32 and 35–36 to their respective inputs. Bipolar transistor diode pairs 29–30 and 33–34 are connected between nodes A–B and D–E respectively to establish a level clamp operating range around the input thresholds or trip points of inverters 25–26 and 27≧28.

Figure 4:
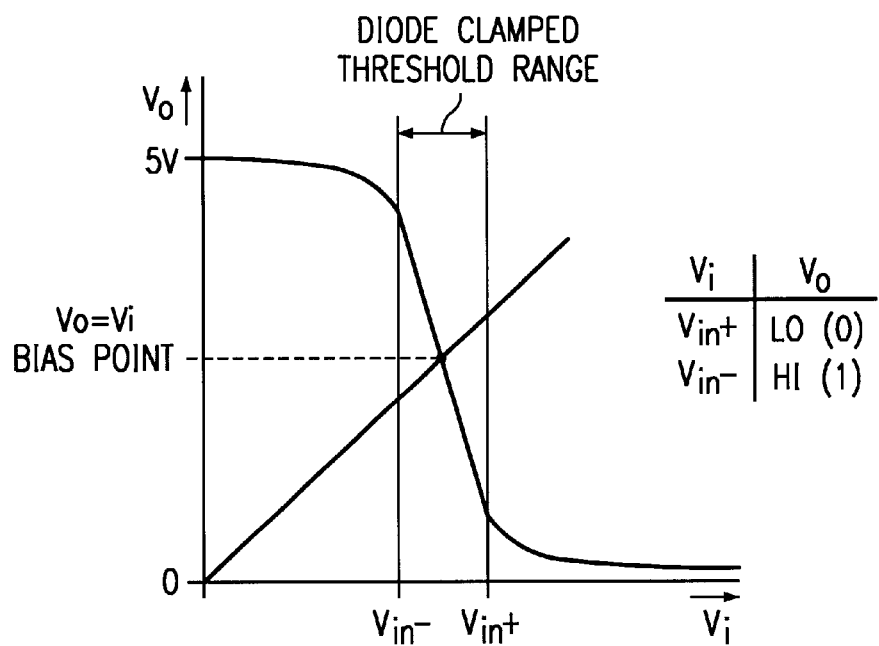
FIG. 4 illustrates the "trip point" biasing for the first inverters.

FIG. 4 illustrates the use of trip point biasing of inverters 25–26 and 27–28 as a means to improve the high speed operation. In FIG. 4, the zero to five output voltage range of the inverters is shown on the ordinate while their much smaller input voltage range is shown on the abscissa. By biasing the circuit at the mid-point of the high-to-low transition, only a small voltage swing $V_{in}+/V_{in}-$ is required at the input of an inverter to cause a complementary CMOS level zero to five volt output swing to occur at the output of the inverter. As illustrated, if the input signal is at a high state $V_{in}+$, the output of the inverter will be a binary low state of near zero volts. Conversely, if the input signal is at a low state $V_{in}-$, then the output will be a binary high state of near five volts. Again, the zero and five volt levels are used as examples only in this description.

Now, referring back to FIG. 3, the outputs of the two inverters at nodes C and F are fast and at CMOS level but have only limited drive capability due to the small size of their components. To drive additional circuits an additional pair of inverters, comprised of transistors 37–38 and 39–40, are added at each of the complementary outputs. Depending on the application requirements, the geometry of these inverters may be on the order of 2× to 3× that of the minimum geometry discussed earlier relative to the first set of inverters. These output inverters can be tailored to provide high speed, complementary outputs at CMOS levels which are capable of driving the desired loads.

Thus there is provided a high-speed, low-cost ECL to CMOS converter which can drive many local area capacitive loads, such as often found in LSI applications. The size of the output drive inverters can be adapted to the specific drive requirements of specific applications. While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. Apparatus for converting low level input signals to CMOS level output signals, said apparatus comprising:
   (a) a pre-amplifier coupled to receive said low level input signals,
   (b) a first buffer stage having its input operatively coupled to a first output of said preamplifier, and
   (c) a first bias circuit for biasing the input voltage level of said first buffer stage to within a small range of the voltage at which the output of said first buffer stage switches from one binary output state to the other; the first bias circuit having a diode pair coupled to the input of the first buffer stage.

2. The apparatus of claim 1 wherein said first buffer stage is designed to have minimal input capacitance.

3. The apparatus of claim 1 further comprising a second buffer stage operatively coupled to the output of said first buffer stage, the geometry of said second buffer stage being adapted to provide adequate drive capability to drive additional circuitry.

4. The apparatus of claim 1 wherein said pre-amplifier is a differential pre-amplifier, and further comprising a third buffer stage having its input operatively coupled to a second output of said differential pre-amplifier and a second bias circuit for biasing the input voltage level of said third buffer stage to within a small range of the input voltage at which the output of said third buffer stage switches from one binary state to the other.

5. The apparatus of claim 4 further comprising second and fourth buffer stages, said second buffer stage being operatively coupled to the output of said first buffer stage and said fourth buffer stage being operatively coupled to the output of said third buffer stage, the geometries of said second and fourth output stages being adapted to provide adequate drive capability to drive additional circuitry.

* * * * *